United States Patent [19]

Speraw

[11] Patent Number: 4,628,413
[45] Date of Patent: Dec. 9, 1986

[54] CARD CASSETTE EJECTOR APPARATUS
[75] Inventor: Floyd G. Speraw, Lexington, S.C.
[73] Assignee: NCR Corporation, Dayton, Ohio
[21] Appl. No.: 810,157
[22] Filed: Dec. 18, 1985
[51] Int. Cl.$^4$ .............................................. H05K 7/16
[52] U.S. Cl. .................................. 361/415; 339/45 M; 339/75 MP; 339/76; 361/394; 361/399; 361/413
[58] Field of Search ............... 361/394, 399, 413, 415; 339/45 M, 75 MP, 76

[56] References Cited

U.S. PATENT DOCUMENTS

| | | | |
|---|---|---|---|
| 3,311,863 | 4/1967 | Beale | 339/45 M |
| 3,375,408 | 3/1968 | Buhrendorf et al. | 361/394 |
| 3,798,507 | 3/1974 | Damon et al. | 361/415 |
| 3,863,113 | 1/1975 | Ward | 361/415 |
| 4,544,066 | 10/1985 | Koppensteiner et al. | 361/415 X |

FOREIGN PATENT DOCUMENTS

| | | | |
|---|---|---|---|
| 2812631 | 10/1978 | Fed. Rep. of Germany | 339/45 M |
| 135437 | 5/1979 | Fed. Rep. of Germany | 361/415 |
| 3013023 | 10/1981 | Fed. Rep. of Germany | 361/399 |

OTHER PUBLICATIONS

Ecker, M. E. and Laurence, P. R., "Latch", IBM Tech. Discl. Bul., vol. 10, No. 11, Apr. 1968 p. 1952.

Primary Examiner—A. T. Grimley
Assistant Examiner—Jane K. Lau
Attorney, Agent, or Firm—Wilbert Hawk, Jr.; Edward Dugas; George Jameson

[57] ABSTRACT

An apparatus is disclosed for selectively controlling the insertion, retention and extraction of card cassettes into, in and from associated channels of a card cage. A pair of first and second levers are pivotally mounted at the top and bottom of each channel. Each of the card cassettes includes upper and lower glides, with each glide including a pin at the front of the glide. Each card cassette if freely slideable in its associated channel of the card cage until the pins in its upper and lower glides become seated into detents in the first and second levers in that channel just before a first set of connectors on that card cassette engage a mating second set of connectors in that channel of the card cage. Rotation of the first and second levers in that channel in a first set of directions pushes the pins in the glides of that card cassette horizontally, forcing the first set of connectors on the card cassette to engage the second set of connectors in that channel. At this time, the engaged first and second sets of connectors are in a locked-in condition and require an external force for disengagement. Rotation of the first and second levers in a second set of directions pulls the pins in the glides of that card cassette horizontally, disengaging the first set of connectors on the card cassette from the second set of connectors in that channel.

5 Claims, 7 Drawing Figures

FIG. 4
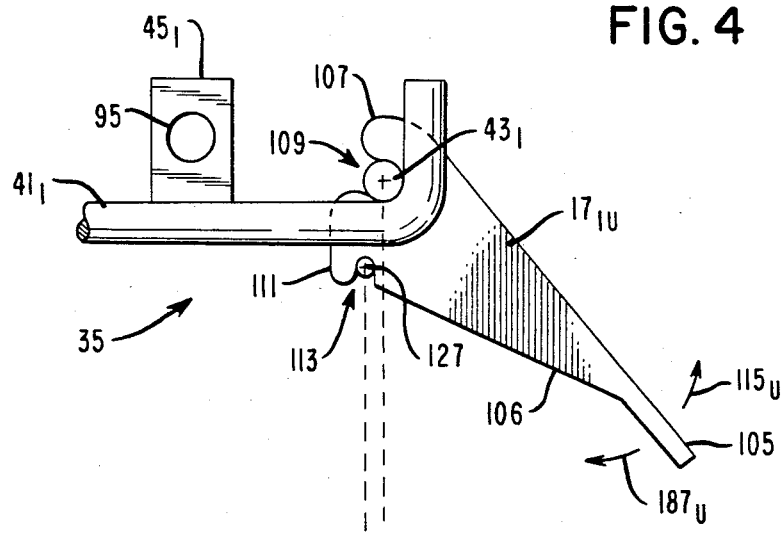
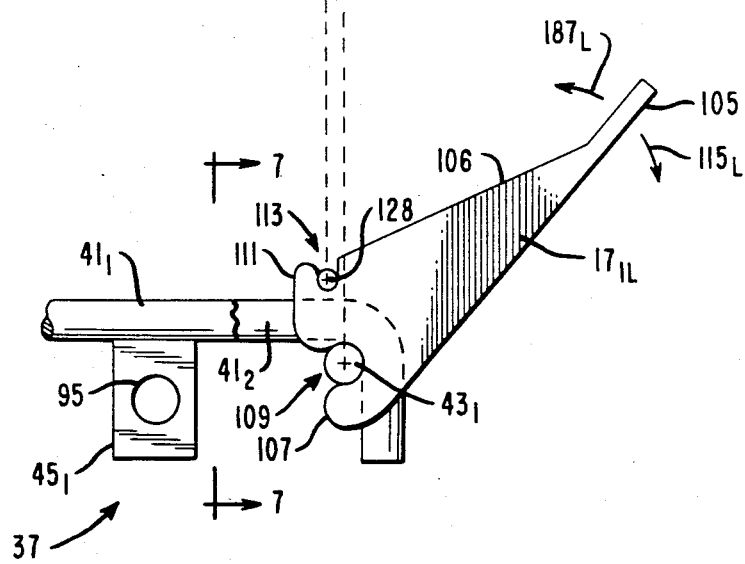
OVER CENTER △ POSITION 191 ← → CENTER POSITION 189

CARD CASSETTE EJECTOR APPARATUS

BACKGROUND OF THE INVENTION

1. Field of the Invention

The present invention relates to equipment for housing printed circuit cards and more particularly to an apparatus for controlling the insertion, retention and ejection of card cassettes into and out of a cassette cage of a housing.

2. Description of the Prior Art

Printed circuit cards containing integrated circuits are commonly slideably mounted in respective parallel slots or channels of a card-carrying cage to minimize space requirements. Each card contains a set of connectors which are engageable with an associated set of mating connectors at the rear of the associated channel of the cage. While the engagement of the mating sets of conductors on a card and the cage is relatively easy, the disengagement of the set of conductors on the card from the associated mating connectors in the cage can present a problem, particularly when there is a relatively large number of pins on each male connector. Such a large number of pins on each of the male connectors requires a substantial force to disengage from the associated mating connectors. To help resolve this problem, card ejectors are commonly used to remove a printed circuit card from the cage. However, such ejectors are commonly mounted to the printed circuit card itself. As a result, when force is exerted on an ejector (or pair of ejectors) to remove a printed circuit card, that force produces a stress on the printed circuit card which can crack or otherwise damage the card as it is being removed from the cage.

The background art known to applicant at the time of the filing of this application is as follows:

U.S. Pat. No. 3,767,974, Insertion And Extraction Lever For Printed Circuit Cards, by D. J. Donovan, Jr., et al.

SUMMARY OF THE INVENTION

Briefly, an ejector apparatus is disclosed which utilizes a mechanical advantage to insert or to eject a card cassette into or from a card or cassette cage with a minimum amount of stress on a printed circuit card in the card cassette and which further uses a mechanical disadvantage of an over center condition to retain the card cassette in the card cage.

In accordance with a first aspect of the invention, there is provided an apparatus comprising: a plurality of card cassettes, each of said card cassettes including upper and lower portions; a housing for selectively receiving said plurality of cassettes; and a plurality of pairs of first and second levers coupled to said housing for respective engagement with said plurality of card cassettes, said first and second levers of a given pair of said first and second levers being respectively rotatable in a first set of directions to respectively engage said upper and lower portions of an associated card cassette to force said associated card cassette into said housing and being respectively rotatable in a second set of directions to respectively engage said upper and lower portions of said associated card cassette to pull said associated card cassette from said housing.

In accordance with a second aspect of the invention, there is provided an apparatus comprising: a card cassette including upper and lower portions; a housing for receiving said card cassettee; and a pair of first and second levers coupled to said housing for engagement with said card cassette, said first and second levers being respectively rotatable in a first set of directions to respectively engage said upper and lower portions of said card cassette to force said card cassette into said housing and being respectively rotatable in a second set of directions to respectively engage said upper and lower portions of said card cassette to pull said card cassette from said housing.

In accordance with a third aspect of the invention, there is provided a lever adapted for inserting and removing a card cassette into and from a housing wherein said lever is rotatably mounted to the housing to selectively engage the card cassette, said lever comprising: a handle; an arcuate section; and a body coupled between said handle and said arcuate section, said arcuate section including an opening of substantially one half of a circle for mounting said lever to the housing, a protuberance adjacent to said opening, and a detent adjacent to said protuberance for engagement with said card cassette when said lever is rotated in a first direction to an engaged position and for disengagement from said card cassette when said lever is rotated in a second direction from said engaged position.

BRIEF DESCRIPTION OF THE DRAWINGS

Various objects, features and advantages of the invention, as well as the invention itself, will become more apparent to those skilled in the art in the light of the following detailed description taken in consideration with the accompanying drawings wherein like reference numerals indicate like or corresponding parts throughout the several views and wherein:

FIG. 4 is a partial side view showing upper and lower ejector levers respectively mounted on associated crosswires of the card cage of FIG. 3 and further respectively seated against associated ejector pins of a card cassette;

DESCRIPTION OF THE PREFERRED EMBODIMENT

Figure 1:
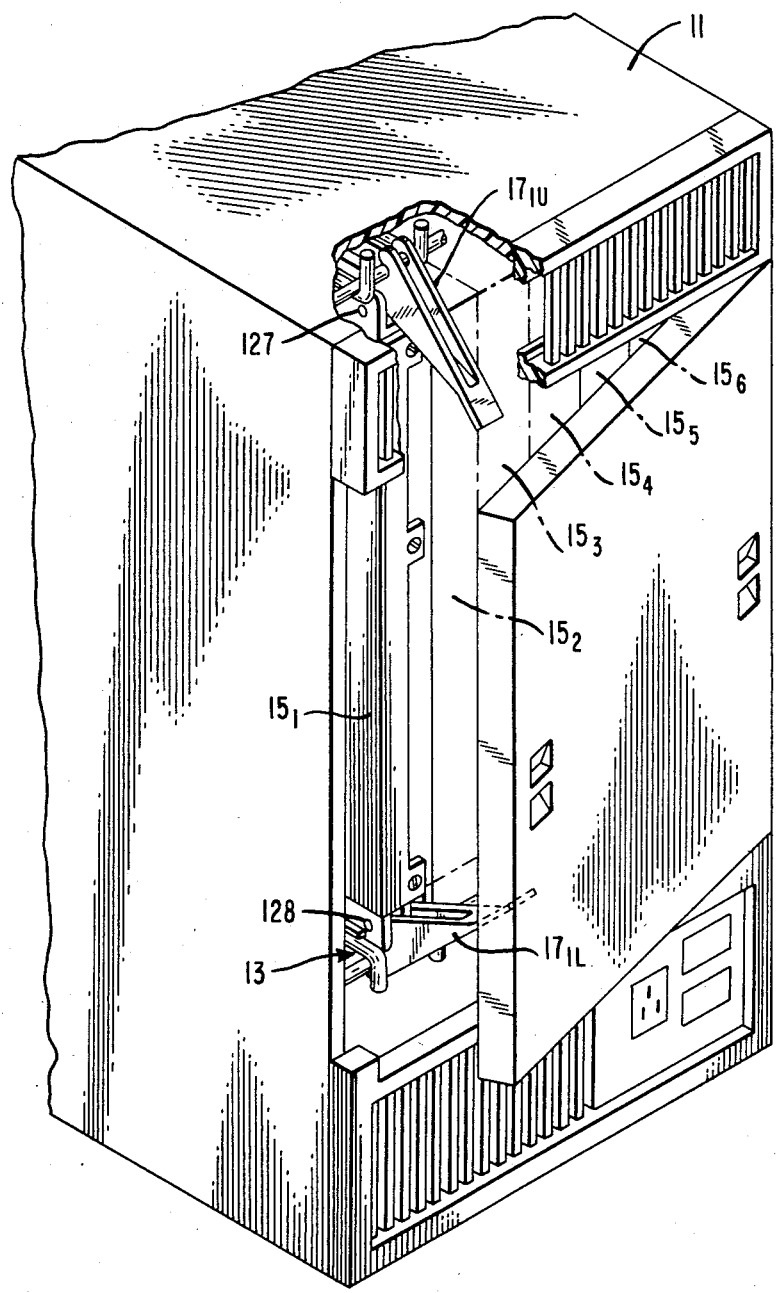
FIG. 1 is a perspective view of a cabinet containing a card cage and showing a representative card cassette partially inserted into (or extracted from) the card cage and other card cassettes fully inserted into the card cage.

Referring now to FIG. 1 of the drawings, a cabinet 11 is shown containing a card cage 13 filled with a plurality of card cassettes $15_1 \ldots 15_N$ (not shown) mounted in parallel slots or channels (FIG. 3) of the card or cassette cage 13. Each of the card cassettes $15_1 \ldots 15_N$ is controllably inserted in, retained in or extracted from its associated channel by means of an associated pair of upper (U) and lower (L) card ejector levers. For the sake of clarity, only the card ejector levers $17_{1U}$ and $17_{1L}$ for card cassette $15_1$ are shown. The card cassette $15_1$ is shown partially inserted into (or extracted from) the card cage 13 while the other ones of the card cassettes $15_2 \ldots 15_N$ are fully retained therein by the associated pairs of card ejector levers (not shown).

Figure 2:
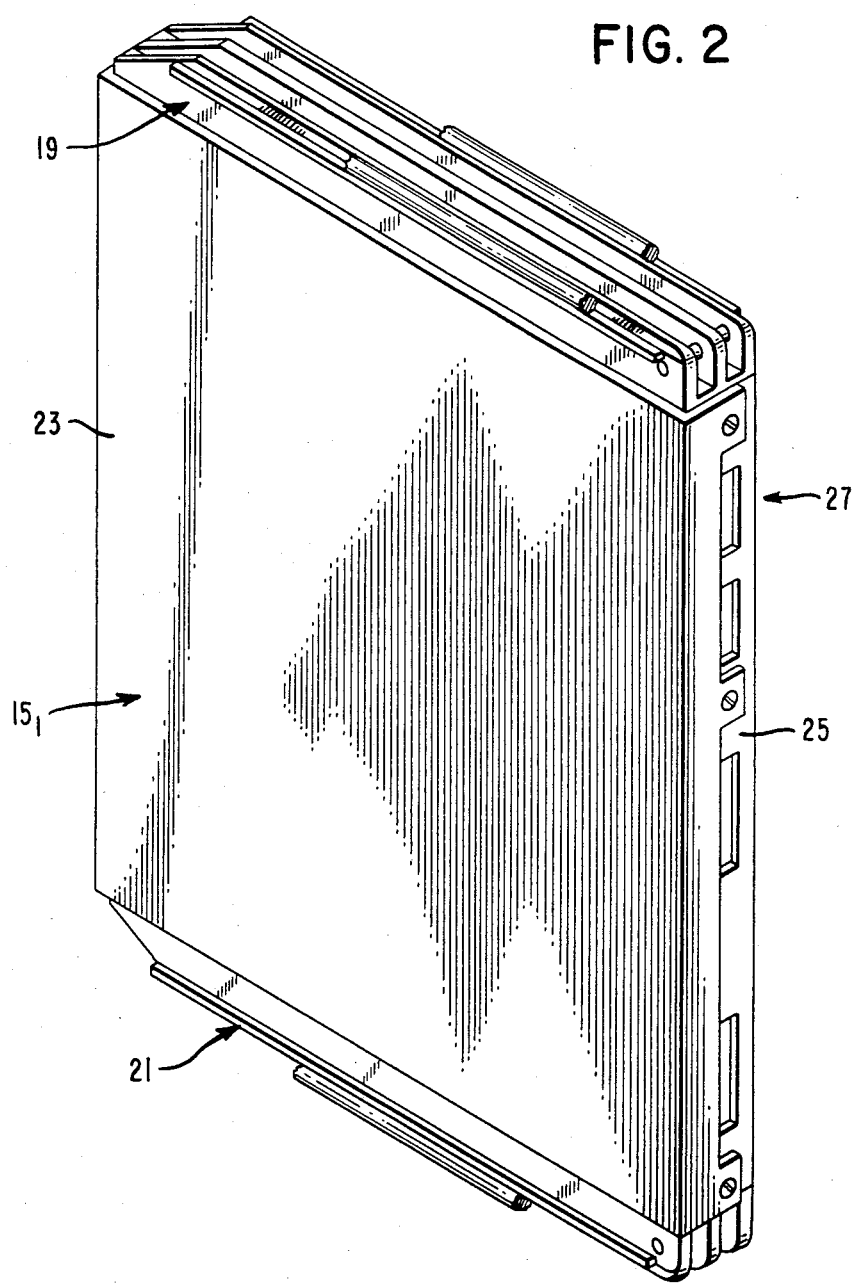
FIG. 2 is a perspective view of one of the card cassettes removed from the card cage of FIG. 1.
Figure 5:
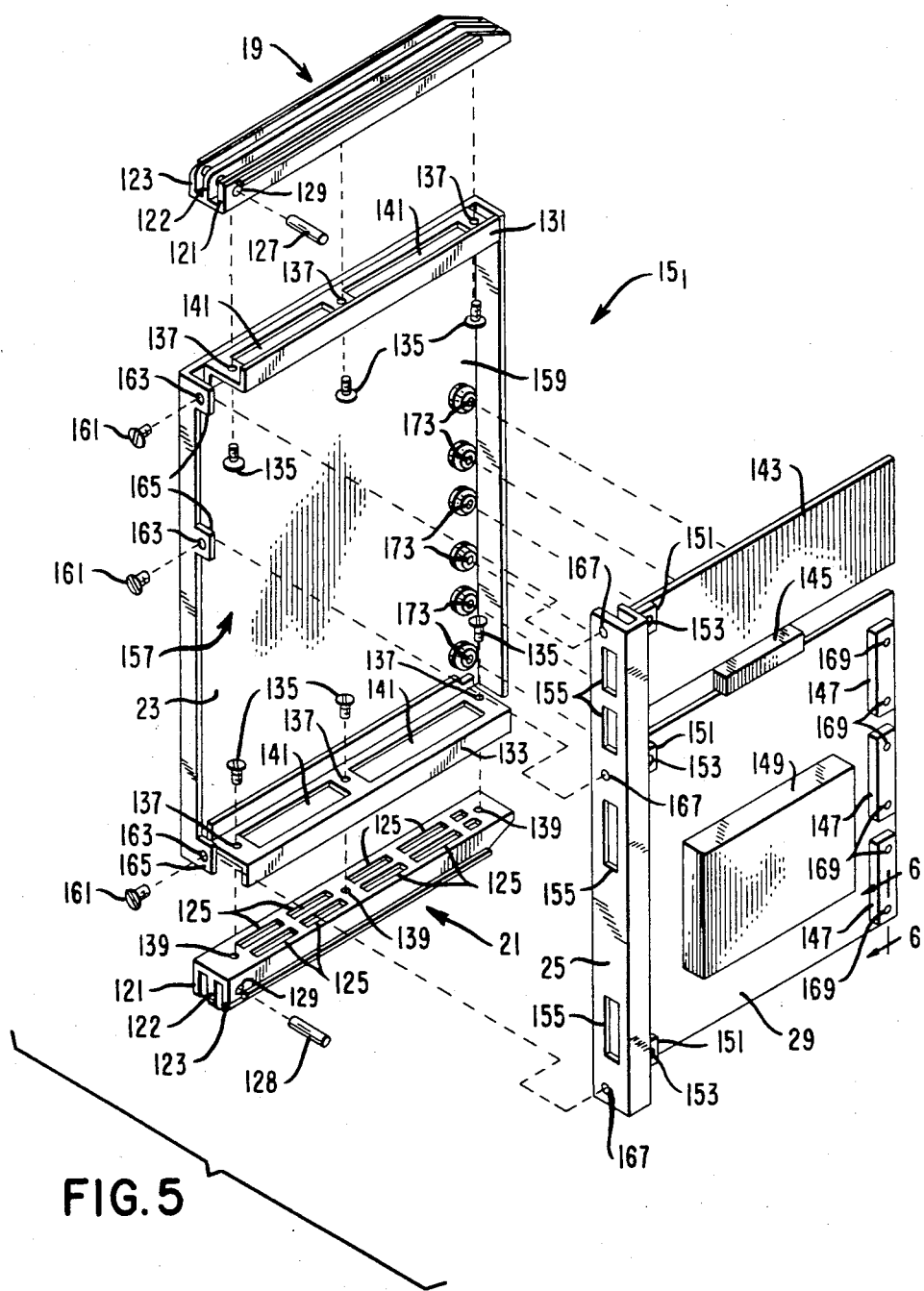
FIG. 5 is an exploded perspective view of the card cassette of FIG. 2.

FIG. 2 shows the exemplary card cassettee $15_1$ removed from the card cage 13 of FIG. 1. As shown in FIG. 2, the card cassette $15_1$ includes an upper glide 19, a lower glide 21, a metal plate 23 and an I/O (input/output) bulkhead 25. Elements 19, 21, 23 and 25 form a cassette 27 for retaining a processor board or printed circuit card 29 (FIG. 5). The elements 19, 21, 23, 25 and 29 will be explained later in more detail in relation to FIG. 5.

Figure 3:
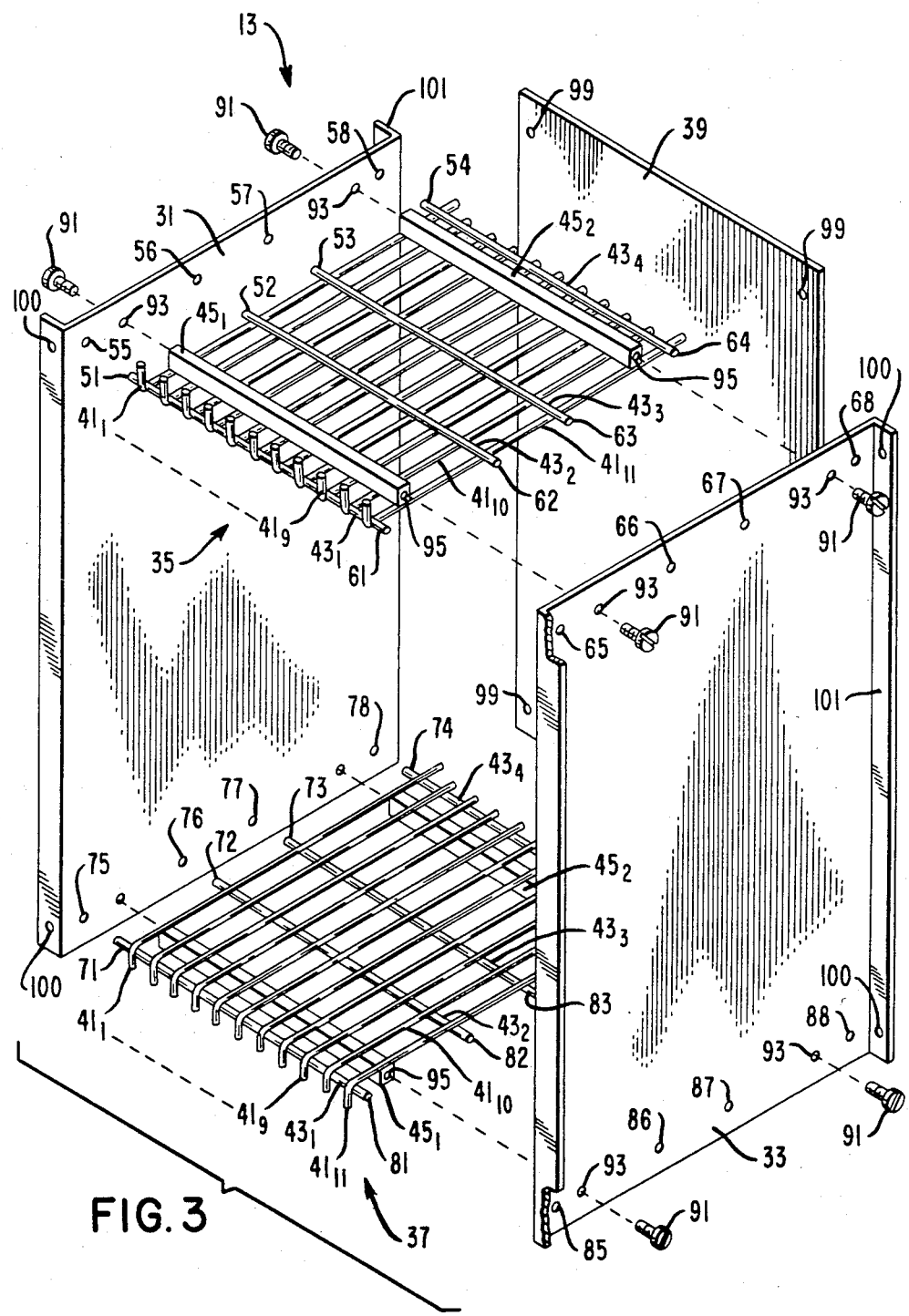
FIG. 3 is an exploded perspective view of the card cage of FIG. 1.

Referring now to FIG. 3, an exploded perspective view of the card cage 13 of FIG. 1 is shown. The card cage 13 is comprised of side frames 31 and 33, upper and lower wire frame racks 35 and 37 and a back frame 39. Each of the wire frame racks 35 and 37 includes a plurality of parallel wires $41_1$–$41_{11}$ running from front to back, a plurality of parallel crosswires $43_1$–$43_4$ orthogonally disposed with respect to the wires $41_1$–$41_{11}$, and crosspieces $45_1$ and $45_2$ positioned parallel to the crosswires $43_1$–$43_4$ and respectively adjacent to the crosswires $43_1$ and $43_4$. Each of the wires $41_1$–$41_{11}$ and $43_1$–$43_4$ has a 0.25 inch diameter. The spacing between the centers of adjacent ones of the wires $41_1$–$41_{11}$ in each of the racks 35 and 37 is 0.8 inch.

The racks 35 and 37 are inverted from each other, such that the front ends of the wires $41_1$–$41_{11}$ in upper rack 35 are turned up over the crosswire $43_1$ in upper rack 35 while the front ends of the wires $41_1$–$41_{11}$ in lower rack 37 are turned down over the crosswire $43_1$ in lower rack 37. In addition, the crosswires $43_1$–$43_4$ and crosspieces $45_1$ and $45_2$ of rack 35 are on top of the wires $41_1$–$41_{11}$ of rack 35, while the crosswires $43_1$–$43_4$ and crosspieces $45_1$ and $45_2$ of rack 37 are on the underside of the wires $41_1$–$41_{11}$ of rack 37.

In the assembly of the card cage 13, left-end portions 51–54 of the respective crosswires $43_1$–$43_4$ of upper rack 35 seat into associated holes 55–58 near the top of side frame 31, right-end portions 61–64 of the respective crosswires $43_1$–$43_4$ of upper rack 35 seat into associated holes 65–68 near the top of side frame 33, left-end portions 71–74 of the respective crosswires $43_1$–$43_4$ of lower rack 37 seat into associated holes 75–78 near the bottom of side frame 31, and right-end portions 81, 82, 83 and 84 (not shown) of the respective crosswires $43_1$–$43_4$ of lower rack 37 seat into associated holes 85–88 near the bottom of side frame 33.

The side frames 31 and 33 are rigidly held against the racks 35 and 37 by screws 91 which are passed through associated holes 93 in the side frames 31 and 33 and screwed into internally threaded holes 95 in both ends of each of the crosspieces $45_1$ and $45_2$ of each of the racks 35 and 37. Screws (not shown) are then passed through holes 99 in the back frame 39 and screwed into internally threaded holes 100 of flanged rear portions 101 of the side frames 31 and 33 to complete the assembly of the card cage 13.

After the card cage 13 has been completely assembled, it is inserted into the cabinet 11 (FIG. 1) and securely mounted thereto by means such as screws (not shown). Then the upper card ejector levers (not shown) respectively associated with the card cassettes $15_1$–$15_N$ (where N=10 in this case) are snapped onto the crosswire $43_1$ of the upper rack 35 (FIG. 3), respectively between associated adjacent ones of the wires $41_1$–$41_{11}$ in the rack 35. Similarly, the lower card ejector levers (not shown) respectively associated with the card cassettes $15_1$–$15_N$ (where N=10 in this case) are snapped onto the crosswire $43_1$ of the lower rack 36 (FIG. 3), respectively between associated adjacent ones of the wires $41_1$–$41_{11}$ in the rack 37.

Each of the upper and lower card ejector levers is preferrably made of nylon and is similar in configuration to each of the others. The configuration of these card ejector levers will be explained by now referring to FIG. 4, which specifically illustrates card ejector levers $17_{1U}$ and $17_{1L}$ for the card cassettes $15_1$.

As shown in FIG. 4, each of the levers $17_{1U}$ and $17_{1L}$ includes a handle 105 at one end and a body 106 which includes an arcuate section 107 at the other end. The arcuate section 107 includes an opening 109 of slightly less than half a circle, a protuberance 111 adjacent to the opening 109 and a detent 113 adjacent to the protuberance 111.

The arcuate sections 107 of the levers $17_{1U}$ and $17_{1L}$ are snapped over the respective crosswires $43_1$ of the upper and lower racks 35 and 37, causing the crosswires $43_1$ of the racks 35 and 37 to respectively seat into the associated openings 109 of the arcuate sections 107. As indicated before, the lever $17_{1U}$ is snapped onto the crosswire $43_1$ of the rack 35 between wires $41_1$ and $41_2$ of the rack 35, while the lever $17_{1L}$ is snapped onto the crosswire $43_1$ of the rack 37 between wires $41_1$ and $41_2$ of the rack 37. The wires $41_1$ of the racks 35 and 37 are respectively shown in front of the ejector levers $17_{1U}$ and $17_{1L}$. However, only a segment of the wire $41_1$ of rack 37 is shown, so that the wire $41_2$ can be shown (a portion of which is in phantom) behind the ejector lever $17_{1L}$. Note that the levers $17_{1U}$ and $17_{1L}$ are oppositely positioned from each other into the respective crosswires $43_1$ of the racks 35 and 37. The operation of the levers $17_{1U}$ and $17_{1L}$ will be explained later.

It should be noted that a decal (not shown) made of magnetic strip tape is adhered to the handle 105 of each of the levers $17_{1U}$ and $17_{1L}$ to identify the associated card cassette, which in this case is card cassette $15_1$ (FIG. 2). Such decals also cause the handles 105 of the levers $17_{1U}$ and $17_{1L}$ to respectively adhere to top and bottom magnetic surfaces (not shown) of the cabinet 11 (FIG. 1) when the lever $17_{1U}$ has been manually rotated upward around the wire $43_1$ of rack 35 in the direction of arrow $115_U$ and into a substantially horizontal position, and the lever $17_{1L}$ has been manually rotated downward around the wire $43_1$ of rack 37 in the direction of arrow $115_L$ and into a substantially horizontal position.

Referring now to FIG. 5, an exploded perspective view is shown of the card cassette $15_1$ of FIG. 2. As discussed before, the card cassette $15_1$ is comprised of upper glide 19, lower glide 21, metal plate 23, I/O bulkhead 25 and processor board or printed circuit card 29.

Each of the glides 19 and 21 is preferrably made of nylon and has a substantially M-shaped configuration consisting of ribs 121, 122 and 123 which run the length of that glide. The glides 19 and 21 also contain slots 125 (as shown in the glide 21) for allowing air to flow therethrough. Ejector release pins 127 and 128 are passed through holes 129 at the front of each of the ribs 121–123 in the respective glides 19 and 21. These ejector release pins 127 and 128, which are used in the insertion, retention or extraction of a card cassette (such as the card cassette 15₁) into, in or from the card cage 13 (FIG. 1), will be discussed later.

After the ejector release pins 127 and 128 are inserted into the respective glides 19 and 21, the various components shown in FIG. 5 are assembled into the card cassette of FIG. 2, as discussed below.

The glides 19 and 21 are respectively seated into and attached to L-shaped brackets 131 and 133 at the top and bottom of the metal plate 23 by means of screws 135, which pass through associated holes 137 in the L-shaped brackets 131 and 133 and into associated internally-threaded holes 139 in the glides 19 and 21. Note that the glides 19 and 21 are inverted in position with respect to each other in order to seat into the respective brackets 131 and 133. Further note that each of the brackets 131 and 133 also contains slots 141 therethrough. In this manner air can freely flow through the glides 19 and 21 and their respective associated brackets 131 and 133.

If a memory sub-module 143 is to be used in the card cassette 15₁ of FIG. 5, it is plugged into a plug 145 on the processor board 29 and then becomes a part of that processor board 29. The processor board 29 includes three connectors 147 mounted on the right-hand side of the board 29 and electronic circuitry 149 for receiving, processing, utilizing and outputting data and control signals.

The I/O bulkhead 25 is C-shaped and has three feet or tabs 151 along one side of its length, with a hole 153 through each of the tabs 151. This bulkhead 25 contains connectors 155 for coupling to mating external connectors (not shown) to ultimately enable control signals and data to be received, processed and returned to external devices (not shown).

To assemble the bulkhead 25 to the processor board 29, the three tabs 151 of the bulkhead 25 are placed on top of the left hand side of the processor board 29, as shown in FIG. 5. Suitable nylon Richco press-in units (not shown) are then pressed through the holes 153 in the tabs 151 of the bulkhead 25 and through coaxially aligned holes (not shown) in the processor board 29 to securely hold the bulkhead 25 to the processor board 29. The assembly of the bulkhead 25 and processor board 29 is then fitted into a recessed portion 157 of the metal plate 23 and against an inside surface 159 of the metal plate 23. Screws 161 are passed through holes 163 in tabs 165 of the metal plate 23 and into internally threaded holes 167 of the bulkhead 25 to complete the assembly of the card cassette 15₁.

It should be noted at this time that tips (not shown) of the nylon Richco press-in units (not shown) protrude from the underside (not shown) of the processor board 29 to provide a nylon spacing between the processor board 29 and the inside surface 159 of the metal plate 23, so that the processor board 29 is physically separated from the metal plate 23.

Figure 6:
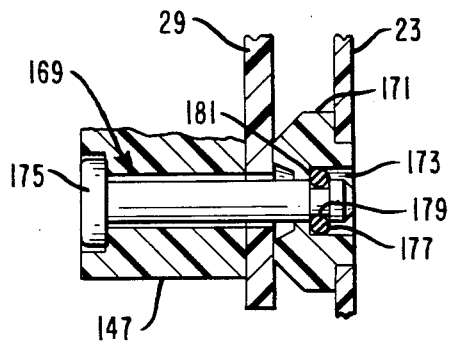
FIG. 6 is a fragmentary view of one of the connectors 147 secured to the metal plate 23, taken from the perspective of line 6—6 of FIG. 5 in the direction of the arrows.

The right-hand side of the processor board 25 is fastened to the metal plate 23 by way of pins (FIG. 6) which pass through holes 169 in the connectors 147 and into respective alignment holes 173 of the metal plate 23. Referring now to FIG. 6, a fragmentary view is illustrated of how one of the connectors 147 of FIG. 5 is secured to the metal plate 23 of FIG. 5.

Although the description of FIG. 6 is directed to the mounting of a portion of the right-hand side of the processor board 29 to the metal plate 23 by way of only one of the holes 169 in one of the connectors 147 shown in FIG. 5, it should be understood that such description also applies to the mounting of the remainder of the right-hand side of the processor board 29 to the metal plate 23 by way of each of the rest of the holes 169 in the connectors 147 of FIG. 5.

As shown in FIG. 6, a grommet 171, preferrably made of neoprene or some other suitable material, is glued into an alignment hole 173 in the metal plate 23. A headed pin 175, preferrably made of steel, is passed through an associated hole 169 in the connector 147 and snapped into the grommet 171. An O-ring 177 is then sealed into a recessed portion 179 around an end of the pin 175 and against a shoulder 181 of the grommet 171 to retain the processor board 29 in close proximity to the metal plate 23. The grommet 171, being made of neoprene or some other suitable resilient material, permits a slight flex to correct for any minor misalignment of the associated connector 147.

Figure 7:
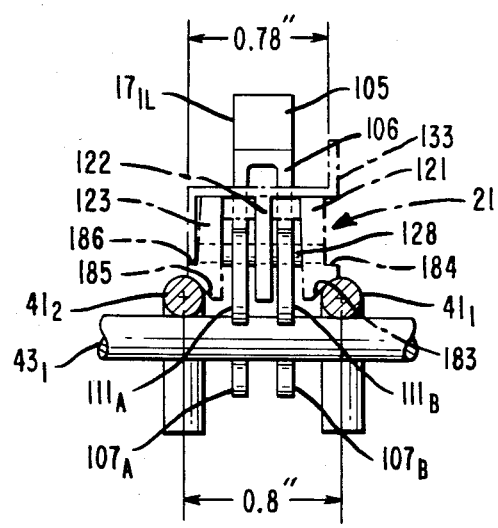
FIG. 7 is a fragmentary view of a glide and an ejector lever in engaging relationship, taken from the perspective of line 7—7 of FIG. 4 in the direction of the arrows.

FIG. 7 is a fragmentary view of the engagement of the lower card ejector level 17₁ₗ (FIG. 4) and its associated glide 21 (FIG. 5), taken from the perspective of line 7—7 of FIG. 4 in the direction of the arrows. To better understand how the cassette 15₁ (FIG. 2) is slideably mounted in the card cage 13 (FIG. 1), both of FIGS. 4 and 7 will now be referred to.

It will be recalled, as shown in FIG. 4, that the arcuate section 107 of lever 17₁ₗ is snapped over the crosswire 43₁ of lower rack 37, causing the crosswire 43₁ of the rack 37 to seat into the opening 109 of the arcuate section 107 between the wires 41₁ and 41₂ of the rack 37. In addition, the lower lever 17₁ₗ (as well as the upper level 17₁ᵤ) includes a handle 105 and a body 106 which includes the arcuate section 107 at the other end. The arcuate section 107 includes the opening 109, protuberance 111 adjacent to the opening 109 and the detent 113 adjacent to the protuberance 111.

As shown in FIG. 7, the components 107, 111 and 113 of the body 106 are split into two sections or portions, with arcuate section 107 being comprised of portions 107$_A$ and 107$_B$ such that protuberance 111 is split into portions 111$_A$ and 111$_B$, each containing a detent 113 (FIG. 4) located at the rear of the portions 111$_A$ and 111$_B$. In this manner, the ejector releases pin 128, which extends through the ribs 121, 122 and 123 of the lower glide 21, is seated into the detent 113 (FIG. 4) at the rear of the protuberance portions 111$_A$ and 111$_B$ of FIG. 7. The glide 21 is attached to the L-shaped bracket 133 (shown in phantom in FIG. 7) which is in turn fastened to the metal plate 23 (see FIG. 5).

Note, as shown in FIG. 7, that the rib 121 of the glide 21 has a bottom portion 183 cut from the lower left to upper right at about a 45 degree angle and that the portion 183 is connected to a shoulder 184 which protrudes outwardly to the right. In a similar manner, the rib 123 of the glide 21 has a bottom portion 185 cut away from lower right to upper left at about a 45 degree angle and the portion 185 is connected to a shoulder 186 which protrudes outwardly to the left.

The bottom portion 183 and 185 of the glide 21 respectively rest between the wires 41₁ and 41₂ of the rack 37. As a result, the card cassette 15₁ (FIG. 2), which includes the upper glide 19 (FIG. 2) and the lower glide 21 (FIGS. 2 and 7), is mounted in the channel between the wires 41₁ and 41₂ (of each of the racks 35 and 37 of FIG. 3) and is slideable into and out of the card cage 13 (FIG. 3). Note that the distance between the ends of the shoulders 184 and 186 of the glide 21 is less than the 0.8 inch between the centers of the wires 41₁ and 41₂ of the channel for the card cassette 15₁. Similar dimensions prevail for the other card cassettes $15_2 \ldots 15_N$ shown in FIG. 1. As a consequence, the remaining cassettes $15_2 \ldots 15_N$ of FIG. 1 can be similarly slideably mounted in associated channels between pairs of the remaining wires $41_2 \ldots 41_{11}$ of each of the racks 35 and 37 (FIG. 3).

The insertion, retention and extraction of the card cassette $15_1$ (FIG. 2) from the card cage 13 (FIG. 3) will now be discussed by again referring to FIGS. 1-7.

INSERTION

It will be recalled that the handles 105 of the levers $17_{1U}$ and $17_{1L}$ of FIG. 4 are adhered to magnetic surfaces (not shown) of the cabinet 11 (FIG. 1) after the levers $17_{1U}$ and $17_{1L}$ have been manually rotated in the directions of the respective arrows $115_U$ and $115_L$ around the associated wires $43_1$ of the respective racks 35 and 37 into substantially horizontal positions. With the levers $17_{1U}$ and $17_{1L}$ in substantially horizontal positions, the protuberances 111 (FIG. 4) are also in horizontal positions. Thus, as the card cassette $15_1$ (FIG. 2) is being pushed horizontally into its associated channel between the wires $41_1$ and $41_2$ of each of the racks 35 and 37 of the card cage 13 of FIG. 3, the ejector release pins 127 and 128 (FIGS. 4 and 5) of the respective glides 19 and 21 are also moving horizontally. These moving pins 127 and 128 strike the protuberance portions $111_A$ and $111_B$, as shown in FIGS. 4 and 7, causing the levers $17_{1U}$ and $17_{1L}$ to be rotated in the directions of the respective arrows $187_U$ and $187_L$ (FIG. 4), and the pins 127 and 128 then engage the respective detents 113 of the levers $17_{1U}$ and $17_{1L}$ as they pass over the levers $17_{1U}$ and $17_{1L}$.

The handles 105 of the levers $17_{1U}$ and $17_{1L}$ (FIGS. 4 and 7) are then simultaneously rotated by an operator in the respective directions indicated by the arrows $187_U$ and $187_L$. This causes the card cassette $15_1$ (FIG. 2) to move from right to left, as indicated in FIG. 4. As the handles 105 are being simultaneously rotated, the portions $111_A$ and $111_B$ (FIG. 7) of the protuberance 111 (FIG. 4) of each of the levers $17_{1U}$ and $17_{1L}$ respectively pass through the gaps between the ribs 121 and 122 and the ribs 122 and 123 of each of the glides 19 and 21. This causes the levers $17_{1U}$ and $17_{1L}$ to start rotating toward the closed position.

When the levers $17_{1U}$ and $17_{1L}$ of FIG. 4 have been rotated such that the centers of the pins 127 and 128 are vertically aligned with the centers of the wires 43, of the racks 35 and 37, the levers $17_{1U}$ and $17_{1L}$ have reached a center position 189. At this center position 189 of the levers $17_{1U}$ and $17_{1L}$, there is a maximum interference or resistance to any further rotation of these levers in the directions indicated by the arrows $187_U$ and $187_L$. This center position 189 of the levers $17_{1U}$ and $17_{1L}$ is also the point where the connectors 147 (FIG. 5) on the card cassette $15_1$ (FIG. 2) have just about made contact with associated mating connectors (not shown) on the back frame 39 of the card cage 13 of FIG. 3.

As the operator simultaneously rotates the levers $17_{1U}$ and $17_{1L}$ further in the directions of the arrows $187_U$ and $187_L$, the pins 127 and 128 move further to the left to an over center $\Delta$ (delta) position 191 (as shown in FIG. 4), causing a mechanical advantage pressure to be applied to the connectors 147 (FIG. 5). As a result, the three connectors 147 at the rear of the card cassette $15_1$ (FIG. 5) seat into associated shrouds (not shown) of the associated mating connectors (not shown) on the back frame 39 (FIG. 3) to engage those associated mating connectors. Thus, at the over center $\Delta$ position 191 of the pins 127 and 128, the connectors 47 (FIG. 5) have fully engaged their associated mating connectors on the back frame 39 of the card cage 13 (FIG. 3).

RETENTION

The card cassette 151 is retained in its associated channel between the wires $41_1$ and $41_2$ of each of the racks 35 and 37 and with its connectors 147 (FIG. 5) fully engaged with their respective mating connectors 147 (not shown) on the back frame 39 of the card cage 13 (FIG. 3) by a locking condition which tends to keep the ejector release pins 127 and 128 at the over center $\Delta$ position 191 (FIG. 4).

To remove the card cassette $15_1$, the handles 105 of the levers $17_{1U}$ and $17_{1L}$ must be moved in the directions of the respective arrows $115_U$ and $115_L$ past the center position 189. It is the above-stated maximum interference or resistance to the rotation of the levers $17_{1U}$ and $17_{1L}$ from the over center $\Delta$ position 191 through or past the center position 189 (in the directions of the arrows $115_U$ and $115_L$) that creates this locking condition, which locking condition keeps the pins 127 and 128 at the over center $\Delta$ position 191 and hence keeps the connectors 147 (FIG. 5) fully engaged with their associated mating connectors (not shown) on the back frame 39 (FIG. 3).

EXTRACTION

To extract or eject the card cassette $15_1$ (FIG. 2) from its above-described channel in the card cage 13 (FIG. 3), the handles 105 of the levers $17_{1U}$ and $17_{1L}$ (FIG. 4) are simultaneously forced by an operator to move in the respective directions indicated by the arrows $115_U$ and $115_L$. This causes the levers $17_{1U}$ and $17_{1L}$ to respectively pull the ejector release pins 127 and 128 (see FIG. 1) of the glides 19 and 21 (FIG. 5), respectively, horizontally from left to right, as shown in FIG. 4. Thus, the horizontal movement of the pins 127 and 128 causes the card cassette $15_1$ to also move horizontally from left to right. The rotational movements of the levers $17_{1U}$ and $17_{1L}$ causes the protuberances 111 of the levers $17_{1U}$ and $17_{1L}$ to pull the pins 127 and 128 from the center position 189 past the over center $\Delta$ position 191 to disengage the connectors 147 (FIG. 5) from their associated mating connectors (not shown) on the back frame 39 of the card cage 13 (FIG. 3). As mentioned before, the maximum interference or opposition to the rotation of the levers $17_{1U}$ and $17_{1L}$ to disengage the connectors 147 from their associated mating connectors (not shown) in the back frame 39 (FIG. 3) occurs at the center position 189 of the levers $17_{1U}$ and $17_{1L}$. Typically, it could require an ejection force of 80 pounds to disengage the 96 pin DIN connectors 149 from the back frame 39. After the levers $17_{1U}$ and $17_{1L}$ pass the center position 189, the connectors 147 have been disengaged from the back frame 39. At this point of rotation of the levers $17_{1U}$ and $17_{1L}$, the operator can either physically grasp the card cassette $15_1$ and remove it from the card cage 13 or he can continue to rotate the levers $17_{1U}$ and $17_{1L}$ until they are in substantially horizontal positions. With the levers $17_{1U}$ and $17_{1L}$ in substantially horizontal positions, the card cassette $15_1$ can be easily removed from the card cage $15_1$ by the operator. In either event, when the card cassette $15_1$ is removed from the card cage 13, the ejector levers $17_{1U}$ and $17_{1L}$ remain with the card cage 13 with their associated arcuate sections 107 snapped over the respective crosswires 43, of the racks 35 and 37 (via the openings 109).

An important feature of this invention is that it utilizes a mechanical advantage to insert or extract a card cassette $15_1$ (FIG. 2) into or from the card cage 13 (FIG. 3).

As shown in FIG. 4, there is a ratio of almost 5:1 between the distance from the center of the opening 109 to the extreme end of the handle 105 of an associated one of either of the levers $17_{1U}$ and $17_{1L}$ and the distance between the center of the opening 109 and the center of the detent 113 of that lever. This ratio provides a mechanical advantage that enables an operator to readily move the handles 105 of the levers $17_{1U}$ and $17_{1L}$ past the center position 189 in either inserting or extracting a desired card cassette $15_1$ from the card cage 13 (FIG. 3). In addition, the opposition presented to the card cassette $15_1$ in moving past this center position 189 prevents the card cassette $15_1$ from coming out of the card cage 13 by itself. For example, if the card cassette $15_1$ were to try to fall out of the card cage 13 by itself during the shipment of the cabinet 11, the resistance or opposition that the card cassette $15_1$ would encounter in going from the over center Δ position 191 past the center position 189 would keep it locked in the card cage 13 at its over center Δ position 191. An external force would be required to remove the cassette $15_1$ from the card cage 13.

Another important feature of this invention is that only a minimum amount of force or stress is placed on the processor board or printed circuit card 29 (FIG. 5) in the insertion, retention or extraction of a card cassette, such as the card cassette $15_1$, into, in or from the card cage 13 (FIG. 3). This minimizes the chance of cracking or otherwise damaging the processor board 29, particularly during the extraction of the card cassette $15_1$ from the card cage 13 when a relatively large amount of force is required to disengage the connectors 147 (FIG. 5) from their associated mating connectors (not shown) on the back frame 39 of the card cage 13 (FIG. 3). Such minimization of stress on the processor board 29 (FIG. 5) is due to the fact that the processor board 29 is mounted to the card cassette $15_1$ (FIG. 5) by way of the metal plate (FIG. 5) and the associated upper and lower card ejector levers $17_{1U}$ and $17_{1L}$ are mounted to the card cage 13 (FIG. 3) and not to the processor board 29 or to the card cassette $15_1$. As a consequence any strain or force applied to the card cassette $15_1$ is transferred from the pins 127 and 128 in the glides 19 and 21 of the card cassette $15_1$ to the connectors 147 (FIG. 5) via the metal plate 23 (FIG. 5) rather than via the processor board 29.

The invention thus provides an apparatus for respectively controlling the insertion, retention and ejection (or extraction) of card cassettes into, in and from a cassette or card cage of a housing with a minimum amount of stress or force being applied to the printed circuit card or processor board of each of the card cassettes.

While the salient features of the invention have been illustrated and described, it should be readily apparent to those skilled in the art that many changes and modifications can be made in the apparatus of the invention presented without departing from the spirit and true scope of the invention. Accordingly, the present invention should be considered as encompassing all such changes and modifications of the invention that fall within the broad scope of the invention as defined by the appended claims.

I claim:

1. An apparatus comprising:
   a plurality of card cassettes, each of said card cassettes including upper and lower portions;
   a housing for selectively receiving said plurality of cassettes; and
   a plurality of pairs of first and second levers coupled to said housing for respective engagement with said plurality of card cassettes, said first and second levels of a given pair of said first and second levers being respectively rotatable in a first set of directions to respectively engage said upper and lower portions of an associated care cassette to force said associated card cassette into said housing and being respectively rotatable in a second set direction to respectively engage said upper and lower portions of said associated card cassette to pull said associated card cassette from said housing;
   said housing including upper and lower racks, said upper rack including a plurality of parallel upper wires and a first crosswire, said lower rack including a plurality of parallel lower wires and a second crosswire, wherein associated pairs of upper and lower wires form a channel for each of said card cassettes;
   each of said upper and lower portions of each of said card cassettes including a pin; and
   each of said first and second levers in a given pair of levers having an opening to enable said lever to be snapped over an associated one of said first and second crosswires, a detent for receiving an associated said pin, and a handle for rotating each said lever in an associated direction to force said associated pin to move horizontally to move an associated card cassette into or out of its associated channel.

2. The apparatus of claim 1 wherein said housing includes:
   an upper rack including a first plurality of wires; and
   a lower rack including a second plurality of wires, an associated pair of upper and lower wires forming a channel for each of said card cassettes.

3. The apparatus of claim 1 wherein:
   each of said card cassettes includes a processor board and an associated set of first connectors; and
   said housing includes a plurality of sets of second connectors respectively associated with said sets of first connectors on said plurality of card cassettes, said first and second sets of connectors associated with a given one of said card cassettes being engaged with each other when said first and second levers associated with said given one of said card cassettes are rotated in said first set of directions, said first and second sets of connectors associated with said given one of said card cassettes being disengaged from each other when said first and second levers associated with said given one of said card cassettes are rotated in said second set of directions.

4. The apparatus of claim 1 wherein:
   the ratio of the distance between said opening and an opposite end of said handle to the distance between said opening and said detent for each of said first and second levers provides a mechanical advantage to aid in moving an associated said card cassette into or out of its associated channel.

5. The apparatus of claim 1 wherein:
each card cassette includes a first set of connectors;
said housing includes a plurality of channels for respectively housing said plurality of card cassettes, each said channel including a second set of connectors matable with said first set of connectors;
each of said upper and lower portions of each said card cassette including a pin at the front of said portion; and
each said lever in said given pair of first and second levers including a detent;
said pins in an associated one of said card cassettes respectively seating into said detents of said given pair of first and second levers when said card cassette is inserted into said housing to enable the rotation of said first and second levers in the first set of directions to respectively push said pins horizontally to force said first set of connectors on said card cassette to engage said second set of connectors in an associated said channel and to enable the rotation of said first and second levers in the second set of directions to respectively pull said pins horizontally to disengage said first and second sets of connectors.

* * * * *